United States Patent
Bergbauer et al.

(10) Patent No.: US 9,806,224 B2
(45) Date of Patent: Oct. 31, 2017

(54) SEMICONDUCTOR LAYER SEQUENCE AND METHOD FOR PRODUCING A SEMICONDUCTOR LAYER SEQUENCE

(71) Applicant: OSRAM Opto Semiconductors GmbH, Regensburg (DE)

(72) Inventors: Werner Bergbauer, Windberg (DE); Philipp Drechsel, Regensburg (DE); Peter Stauß, Regensburg (DE); Patrick Rode, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/763,464

(22) PCT Filed: Jan. 28, 2014

(86) PCT No.: PCT/EP2014/051607
§ 371 (c)(1),
(2) Date: Jul. 24, 2015

(87) PCT Pub. No.: WO2014/118162
PCT Pub. Date: Aug. 7, 2014

(65) Prior Publication Data
US 2015/0364641 A1 Dec. 17, 2015

(30) Foreign Application Priority Data
Jan. 31, 2013 (DE) .................. 10 2013 101 000

(51) Int. Cl.
*H01L 29/15* (2006.01)
*H01L 31/0256* (2006.01)
(Continued)

(52) U.S. Cl.
CPC .... *H01L 33/0075* (2013.01); *H01L 31/03044* (2013.01); *H01L 31/035272* (2013.01);
(Continued)

(58) Field of Classification Search
CPC ............ H01L 33/0075; H01L 33/0079; H01L 31/03044; H01L 33/24; H01L 33/22;
(Continued)

(56) References Cited

U.S. PATENT DOCUMENTS 6,822,270 B2  11/2004  Koide et al.
8,450,749 B2   5/2013  Tu et al.
(Continued)

FOREIGN PATENT DOCUMENTS

CN   1438717 A    8/2003
CN   102237454 A  11/2011
(Continued)

OTHER PUBLICATIONS

Dadgar, A., et al., "Metalorganic chemical vapor phase epitaxy of gallium-nitride on silicon," Physica Status Solidi (c), No. 6, Aug. 12, 2003, pp. 1583-1606.
(Continued)

*Primary Examiner* — Thanh Y Tran
(74) *Attorney, Agent, or Firm* — Slater Matsil, LLP (57) ABSTRACT

A semiconductor layer sequence includes a first nitridic compound semiconductor layer, a second nitridic compound semiconductor layer, and an intermediate layer arranged between the first and second nitridic compound semiconductor layers. Beginning with the first nitridic compound semiconductor layer, the intermediate layer and the second nitridic compound semiconductor layer are arranged one after the other in a direction of growth of the semiconductor layer sequence and are adjacent to each other in direct succession. The intermediate layer has a lattice constant different from the lattice constant of the first nitridic compound semiconductor layer at least at some points. The second nitridic compound semiconductor layer is lattice-adapted to the intermediate layer at least at some points.

13 Claims, 6 Drawing Sheets

(51) Int. Cl.
- *H01L 33/00* (2010.01)
- *H01L 33/12* (2010.01)
- *H01L 31/0304* (2006.01)
- *H01L 31/0352* (2006.01)
- *H01L 31/18* (2006.01)
- *H01L 33/02* (2010.01)
- *H01L 33/22* (2010.01)
- *H01L 33/24* (2010.01)
- *H01L 33/32* (2010.01)

(52) U.S. Cl.
CPC ...... *H01L 31/1856* (2013.01); *H01L 31/1892* (2013.01); *H01L 33/007* (2013.01); *H01L 33/0025* (2013.01); *H01L 33/0079* (2013.01); *H01L 33/025* (2013.01); *H01L 33/12* (2013.01); *H01L 33/22* (2013.01); *H01L 33/24* (2013.01); *H01L 33/32* (2013.01)

(58) Field of Classification Search
CPC ........... H01L 33/025; H01L 31/035272; H01L 33/32; H01L 33/0025; H01L 31/1892; H01L 31/1856; H01L 33/12; H01L 33/007

See application file for complete search history.

(56) References Cited

U.S. PATENT DOCUMENTS

| | | | |
|---|---|---|---|
| 2003/0092263 A1* | 5/2003 | Koike | B82Y 20/00 438/689 |
| 2003/0119239 A1* | 6/2003 | Koike | H01L 33/007 438/200 |
| 2005/0118752 A1 | 6/2005 | Otsuka et al. | |
| 2008/0217645 A1 | 9/2008 | Saxler et al. | |
| 2008/0220555 A1 | 9/2008 | Saxler et al. | |
| 2010/0117111 A1 | 5/2010 | Illek et al. | |
| 2010/0208763 A1 | 8/2010 | Engl et al. | |
| 2010/0295015 A1 | 11/2010 | Kang et al. | |
| 2011/0248241 A1 | 10/2011 | Shimizu et al. | |
| 2011/0266552 A1 | 11/2011 | Tu et al. | |
| 2012/0049224 A1 | 3/2012 | Mizutani et al. | |
| 2012/0153439 A1 | 6/2012 | Sugawara et al. | |
| 2012/0292632 A1 | 11/2012 | Shioda et al. | |
| 2013/0062612 A1 | 3/2013 | Shioda et al. | |

FOREIGN PATENT DOCUMENTS

| | | |
|---|---|---|
| DE | 20122426 U1 | 12/2005 |
| JP | H11121799 A | 4/1999 |
| JP | 03264314 A | 9/2003 |
| JP | 2005159207 A | 6/2005 |
| JP | 2008060331 A | 3/2008 |
| JP | 2010521065 A | 6/2010 |
| JP | 2012074665 A | 4/2012 |
| JP | 2012094752 A | 5/2012 |
| JP | 2012094905 A | 5/2012 |
| JP | 2012134294 A | 7/2012 |
| JP | 2012256833 A | 12/2012 |
| JP | 5127978 B1 | 1/2013 |
| WO | 9930373 A1 | 6/1999 |

OTHER PUBLICATIONS

Drechsel, P., et al., "Impact of buffer growth on crystalline quality of GaN grown on Si(111) substrates," Physica Status Solidi A 209, No. 3, Jan. 17, 2012, pp. 427-430.

Drechsel, P., et al., "Strain controlled growth of crack-free GaN with low defect density on silicon (111) substrate," Journal of Crystal Growth 315, Sep. 16, 2010, pp. 211-215.

* cited by examiner

SEMICONDUCTOR LAYER SEQUENCE AND METHOD FOR PRODUCING A SEMICONDUCTOR LAYER SEQUENCE

This patent application is a national phase filing under section 371 of PCT/EP2014/051607, filed Jan. 28, 2014, which claims the priority of German patent application 10 2013 101 000.8, filed Jan. 31, 2013, each of which is incorporated herein by reference in its entirety.

TECHNICAL FIELD

A semiconductor layer sequence and a method for producing it are specified. The semiconductor layer sequence can be an electronic, in particular an optoelectronic, semiconductor layer sequence.

BACKGROUND

The article Physica Status Solidi c, No. 6, 1583-1606 (2003)/DOI 10.1002/pssc.200303122 relates to a method for producing semiconductor layer sequences.

SUMMARY

Embodiments specify a semiconductor layer sequence which is producible cost-effectively and in a material-saving manner.

In accordance with at least one embodiment of the semiconductor layer sequence, the latter comprises a first nitridic compound semiconductor layer, a second nitridic compound semiconductor layer and an intermediate layer arranged between the first and second nitridic compound semiconductor layers. In the present context, "nitridic compound semiconductor layer" and/or "intermediate layer" should be understood to mean a semiconductor layer which at least in places comprises a nitride compound semiconductor material or consists of a nitride compound semiconductor material.

"Nitride compound semiconductor material" should be understood to mean a semiconductor material which comprises or consists of $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise for example one or a plurality of dopants and additional constituents. For the sake of simplicity, however, the above formula includes only the essential constituents of the crystal lattice (Al, Ga, In, N), even if these can be replaced and/or supplemented in part by small amounts of further substances.

The first nitridic compound semiconductor layer and the second nitridic compound semiconductor layer at least in places do not directly adjoin one another, but rather are spaced apart from one another by the intermediate layer. That is to say that the first nitridic compound semiconductor layer and the second nitridic compound semiconductor layer adjoin, in particular directly, the intermediate layer in each case with a surface facing the intermediate layer. Furthermore, it is conceivable that, upon formation of microcracks in the intermediate layer, the second nitridic compound semiconductor layer is at least partly connected to the first nitridic compound semiconductor layer at least in places via the microcracks of the intermediate layer.

In accordance with at least one embodiment of the semiconductor layer sequence, beginning with the first nitridic compound semiconductor layer, the intermediate layer and the second nitridic compound semiconductor layer are arranged successively in a growth direction of the semiconductor layer sequence and adjoin one another directly in succession. In the present context, "growth direction" should be understood to mean the direction of the growth of the semiconductor layer sequence.

In accordance with at least one embodiment of the semiconductor layer sequence, the intermediate layer at least in places has a different lattice constant than the first nitridic compound semiconductor layer. In the present context, "lattice constant" can also be understood to mean an average lattice constant.

That is to say that the intermediate layer is not matched to a lattice constant of the first nitridic compound semiconductor layer. The intermediate layer firstly grows on the first nitridic compound semiconductor layer in the scope of the production tolerance, wherein in the course of the growth the intermediate layer, in particular with microcracking, relaxes and at least in places has a lattice constant specific to the intermediate layer. The specific lattice constant is different than the lattice constant of the first nitridic compound semiconductor layer. In other words, the intermediate layer grows to the greatest possible extent independently of the lattice constant predefined by the first nitridic compound semiconductor layer. The non-lattice-matched growth of the intermediate layer on the first nitridic compound semiconductor layer can be controlled, influenced and/or determined in particular by process parameters during the growth process of the intermediate layer.

In the present context, "growth" should be understood to mean, in particular, epitaxial growth by means of chemical vapor deposition (CVD) or physical vapor deposition, for example molecular beam epitaxy (MBE). Furthermore, liquid phase epitaxy (LPE) or hybrid vapor phase epitaxy (HVPE) are conceivable. Deposition, coating and/or growth methods can be used for the growth of the semiconductor layer sequence. In particular, chemical vapor deposition (CVD) with, if appropriate, advantageous variants such as, inter alia, MOCVD (metal organic CVD), PECVD (plasma enhanced CVD), HFCVD (hot filament CVD), LPCVD (low pressure CVD) and APCVD (atmospheric pressure CVD) are used. In the present context, chemical vapor deposition (CVD) or physical vapor deposition should be understood in each case as basic principles for the growth of the semiconductor layer sequence and thus cover further method variants that are based on the above basic principles.

In accordance with at least one embodiment of the semiconductor layer sequence, the second nitridic compound semiconductor layer is lattice-matched to the intermediate layer at least in places. In the present context, "lattice-matched" should be understood to mean that a deviation of the specific lattice constant of the intermediate layer with respect to a specific lattice constant of the second nitridic compound semiconductor layer in a lateral direction at least in places is not greater than 1%. That is to say that the second nitridic compound semiconductor layer grows on the basis of the lattice constant of the intermediate layer in the scope of the production tolerance. The lattice-matched growth of the second nitridic compound semiconductor layer on the intermediate layer can be controlled, influenced and/or regulated in particular by process parameters during the growth process on the intermediate layer.

Non-lattice-matched growth should be understood to mean non-pseudomorphic growth of the intermediate layer described here. Lattice-matched growth should be understood to mean, in particular pseudomorphic growth of the second nitridic compound semiconductor layer described here. An expansion of the lattice constant in a lateral direction is maintained during pseudomorphic growth. An expansion of the lattice constant perpendicularly to the lateral direction can change in particular on account of the atomic bonds in the crystal and the resultant forces, wherein Poisson's ratio can describe the above expansion.

In accordance with at least one embodiment of the semiconductor layer sequence, the latter comprises a first nitridic compound semiconductor layer, a second nitridic compound semiconductor layer, and an intermediate layer arranged between the first nitridic compound semiconductor layer and second nitridic compound semiconductor layer, wherein, beginning with the first nitridic compound semiconductor layer, the intermediate layer and the second nitridic compound semiconductor layer are arranged successively in a growth direction of the semiconductor layer sequence and adjoin one another directly in succession. The intermediate layer at least in places has a different lattice constant than the first nitridic compound semiconductor layer, and the second nitridic compound semiconductor layer is lattice-matched to the intermediate layer at least in places.

Nitridic compound semiconductor layers which comprise nitride compound semiconductor materials or consist of nitride compound semiconductor materials have high stresses in particular during growth and in particular cooling on commercially available substrates, in particular silicon growth substrates. The stresses can lead in particular to damage to the nitridic compound semiconductor layers. In particular, lattice mismatches of the substrates and different coefficients of thermal expansion during growth and in particular cooling of nitridic compound semiconductor layers lead to macroscopic cracking in the nitridic compound semiconductor layers. In particular, epitaxial growth and cooling of nitride compound semiconductor materials on cost-effective silicon growth substrates is not readily possible without a layer sequence that forms having damage. By way of example, the damage can be present in the form of macrocracks. Silicon growth substrates have the advantage that they are significantly more expedient than sapphire substrates, for example.

In the present context, "macrocracks" should be understood to mean cracks which extend through the entire semiconductor layer sequence and thus destroy in particular light-generating LED structures. In the present context, "microcracks" should be understood to mean cracks which can form within a layer or layer sequence, for example the intermediate layer. In other words, the main difference between micro- and macrocracks is that the microcracks described here occur in the intermediate layer and the nitridic compound semiconductor layers surrounding the intermediate layer have no microcracks. The microcracks that form in the intermediate layer are arranged significantly closer to one another in comparison with the macrocracks.

In the case of the semiconductor layer sequence described here it has surprisingly been established that during lattice-matched growth of the second nitridic compound semiconductor layer on the intermediate layer provided therefor, the second nitridic compound semiconductor layer grows in a compressively strained fashion. After completion of the semiconductor layer sequence, in particular cooling, the compressive strain counteracts the tensile strain that forms. No macroscopic cracks form in the semiconductor layer sequence. In particular, detectable microcracks in the intermediate layer can be enlisted as a basis for this surprising conclusion, said microcracks being based on non-lattice-matched or non-pseudomorphic growth of the intermediate layer on the first nitridic compound semiconductor layer. As a result of the non-lattice-matched growth of the intermediate layer, the intermediate layer relaxes during growth, when the microcracks described here form in the intermediate layer.

In other words, nondestructive epitaxial growth of the semiconductor layer sequence described here on silicon growth substrates is possible. That is to say that, in particular, silicon growth substrates can be used by virtue of the semiconductor layer sequence described here. In this case, the result with regard to the epitaxially grown semiconductor layer sequence is comparable to semiconductor layer sequences grown on sapphire or silicon carbide.

In accordance with at least one embodiment of the semiconductor layer sequence, the first nitridic compound semiconductor layer comprises a nitride compound semiconductor material which comprises or consists of $Al_n In_m In_{1-n-m} N$, wherein $0 \leq n \leq 1$, $0 \leq m \leq 1$ and $n+m \leq 1$, the second nitridic compound semiconductor layer comprises a further nitride compound semiconductor material, which comprises or consists of $Al_x In_y Ga_{1-x-y} N$, wherein $0 \leq x \leq 1$, $0 \leq y \leq 1$ and $x+y \leq 1$ and the intermediate layer comprises a nitride compound semiconductor material which comprises or consists of $Al_r In_s Ga_{1-r-s} N$, wherein $0 \leq r \leq 1$, $0 \leq s \leq 1$ and $r+s \leq 1$.

The indices n, m can deviate in particular from the indices x, y. By way of example, the indices n, m with respect to the indices x, y deviate from one another by 10% in each case. The aluminum content is higher in the intermediate layer than in the first and second nitridic compound semiconductor layers. The nitride compound semiconductor material described here can furthermore be doped, for example, in order to form an active layer. By way of example, the second nitridic compound semiconductor layer can have n-doped and p-doped regions, wherein the active layer can form between the n-doped region and the p-doped region.

The intermediate layer can consist completely of AlN, for example. Furthermore, it can consist in particular of a material $Al_r Ga_{1-r} N$ with r increasing in the growth direction, wherein $0 < r \leq 1$. In this case, r can assume in particular values of between 0.1 and 0.95. The increase in the aluminum content can be linear with increasing growth duration or the thickness of the intermediate layer can have a higher aluminum content. In other words, a material gradient forms with regard to the aluminum content in the intermediate layer, wherein the aluminum content increases with increasing growth duration in the growth direction of the layer sequence. The growth parameters induce relaxation of the intermediate layer and microcracks form in the intermediate layer, which microcracks can be based in particular on the material gradient.

In accordance with at least one embodiment of the semiconductor layer sequence, the second nitridic compound semiconductor layer can have an increasing concentration of silicon doping and/or a constant concentration of silicon doping for example in the growth direction of the semiconductor layer sequence. As a result of a silicon doping, the second nitridic compound semiconductor layer, in particular, can have an improved current distribution.

In accordance with at least one embodiment of the semiconductor layer sequence, the nitride compound semiconductor material of the first nitridic compound semiconductor layer and the further nitride compound semiconductor material of the second nitridic compound semiconductor layer are identical. In other words, the indices n, m of the first nitridic compound semiconductor layer assume the same values as the indices x, y of the second nitridic compound semiconductor layer. With regard to the first and second nitridic compound semiconductor layer, "identical" should be understood to mean a chemical composition that is identical in the scope of the production tolerance. By way of example, the semiconductor layer sequence described here can have the following composition: GaN/AlN/GaN, wherein GaN denotes the first nitridic compound semiconductor layer, AlN denotes the intermediate layer and GaN denotes the second nitridic compound semiconductor layer.

However, "identical" does not mean that the first and second nitridic compound semiconductor layers are identical with regard to their lattice constant in the scope of the production tolerance. In the scope of the production tolerance, with regard to an atomic composition, a pseudomorphically grown first nitridic compound semiconductor layer can be identical to a non-pseudomorphically grown second nitridic compound semiconductor layer, wherein lattice constants are different.

In accordance with at least one embodiment of the semiconductor layer sequence, the intermediate layer comprises microcracks and the second nitridic compound semiconductor layer is present in the microcracks at least in places. The intermediate layer has a different lattice constant than the first nitridic compound semiconductor layer. That is to say that the intermediate layer is grown in a non-lattice-matched fashion or non-pseudomorphically on the first nitridic compound semiconductor layer. As a result, microcracks form with increasing layer thickness in the intermediate layer, said microcracks passing completely through the intermediate layer at least in places. Furthermore, the second nitridic compound semiconductor layer can be in contact with the first nitridic compound semiconductor layer, through the microcracks formed in the intermediate layer.

In other words, the intermediate layer comprises at least in places individual intermediate layer blocks and/or intermediate layer islands which in total describe the intermediate layer and at least in places are not in direct contact with one another. That is to say that the first nitridic compound semiconductor layer can come into direct contact for example with process gases through the intermediate layer by virtue of the microcracks of the intermediate layer.

The second nitridic compound semiconductor layer grown in a lattice-matched fashion on the intermediate layer grows in an island-like fashion in the microcracks and on the individual intermediate layer blocks and/or intermediate layer islands of the intermediate layer that are formed by the microcracks. With increasing growth duration of the second nitridic compound semiconductor layer, the nitride compound semiconductor material of the second nitridic compound semiconductor layer fuses, combines and/or coalesces to form a laterally homogeneously formed second nitridic compound semiconductor layer. The growth starts simultaneously in the cracks of the intermediate layer and also on the intermediate layer blocks and/or intermediate layer islands.

In accordance with at least one embodiment of the semiconductor layer sequence, the intermediate layer has an aluminum content which is greater than the aluminum content of the first nitridic compound semiconductor layer and second nitridic compound semiconductor layer. By way of example, the aluminum content of the intermediate layer is at least 85%. An aluminum content of 100% is also conceivable. That is to say that the nitridic compound semiconductor layer comprises no elemental gallium in the scope of the production tolerance. As a result of the higher content of aluminum in the intermediate layer, the intermediate layer in the relaxed state has a smaller lattice constant than the nitridic compound semiconductor layer adjoining the intermediate layer in the relaxed state. That is to say that if for example the first and second nitridic compound semiconductor layers are free of aluminum, then in the relaxed state they have a larger lattice constant than the aluminum-containing intermediate layer.

In the present context, "relaxed state" should be understood to mean an unstrained state of the layers described here.

In accordance with at least one embodiment of the semiconductor layer sequence, the intermediate layer has a smaller lattice constant than the first nitridic compound semiconductor layer and second nitridic compound semiconductor layer. As a result of the significantly higher aluminum content of the intermediate layer as described here, said intermediate layer has a smaller lattice constant in comparison with the first and second nitridic compound semiconductor layers. That is to say that the intermediate layer maintains its smaller lattice constant during growth onto the first nitridic compound semiconductor layer. During the growth of the second nitridic compound semiconductor layer, however, the second nitridic compound semiconductor layer at least in places adopts the lattice constant of the intermediate layer, which is smaller than the material-typical lattice constant of the second nitridic compound semiconductor layer. As a result, the second nitridic compound semiconductor layer grows in a compressively strained fashion on the intermediate layer.

In accordance with at least one embodiment of the semiconductor layer sequence, the first nitridic compound semiconductor layer comprises a masking layer. In the present context, "comprises" should be understood to mean that the masking layer is formed within the first nitridic compound semiconductor layer; by way of example, the masking layer is integrated or embedded in the first nitridic compound semiconductor layer and/or grown between two successive layer regions of the first nitridic compound semiconductor layer.

The masking layer can in particular comprise silicon nitride or consist of a silicon nitride. The masking layer can bring about a reduction of a dislocation density in the first nitridic compound semiconductor layer. Furthermore, a masking layer can bring about a reduction of defects (misfits) in the first nitridic compound semiconductor layer. The masking layer of the first nitridic compound semiconductor layer is an optional component of the semiconductor layer sequence and its presence does not induce the surprising observation described here of the second nitridic semiconductor layer sequence grown in a compressively strained fashion.

In accordance with at least one embodiment of the semiconductor layer sequence, the intermediate layer has a layer thickness of between 5 nm and 100 nm. The range indicated here with regard to the layer thickness of the intermediate layer preferably influences the production of a semiconductor layer sequence with a particularly high compressive strain.

In accordance with at least one embodiment of the semiconductor layer sequence, the second nitridic compound semiconductor layer is compressively strained after its growth. The compressive strain of the second nitridic compound semiconductor layer is induced by the intermediate layer grown non-pseudomorphically or in a non-lattice-matched fashion and the microcracks of the intermediate layer. That is to say that the compressive strain of the second nitridic compound semiconductor layer is based on the pseudomorphic or lattice-matched growth of the second nitridic compound semiconductor layer on the intermediate layer. The second nitridic compound semiconductor layer is matched to the lattice constant of the intermediate layer during growth as a result of process parameters, such that the second nitridic compound semiconductor layer grows in a compressively strained fashion.

In the present context, "process parameters" should be understood to mean process parameters which can be regulated, varied and/or controlled before, during or after growth of a semiconductor layer. By way of example, pressure, temperature, gas flow rate of the individual elements of the nitride compound semiconductor materials used, flow velocity and/or growth rate or growth velocity are possible process parameters which can influence in particular the lattice-matched or non-lattice-matched growth of the nitridic compound semiconductor layers and intermediate layer described here.

A growth process for forming the first and second nitridic compound semiconductor layers can be described for example by GaN growth processes based on trimethylgallium (TMGa) and a V/III ratio, in particular determined by an $NH_3$ flow in the reactor.

In accordance with at least one embodiment of the semiconductor layer sequence, a temperature range of between approximately 800-1100° C. is set for the non-pseudomorphic growth of the intermediate layer. Finally, the pressure is set to 50-150 mbar and a low V/III ratio in the range of 50 to 5000, particularly preferably 50 to 500, is set. The ratio of trimethylgallium (TMGa) to trimethylaluminum (TMAl) form the material gradient described here with regard to the aluminum content of the intermediate layer. A proportion of hydrogen in the carrier gas can be varied depending on the desired size of cavities described here in the intermediate layer. The second nitridic compound semiconductor layer is then grown onto the intermediate layer in particular in an undoped fashion and a reactor operating point corresponds to GaN growth conditions, for example.

In particular, the semiconductor layer sequence described here can build up a higher compressive strain if the second nitridic compound semiconductor layer adjoining the intermediate layer is undoped. This can result in an increased compensation of the semiconductor layer sequence during cooling of the semiconductor layer sequence. The compressive strain described here can be obtained in particular even if at least in part the first plies of the second nitridic compound semiconductor layer, said first plies being grown directly into the intermediate layer, are formed in an undoped fashion.

In accordance with at least one embodiment of the semiconductor layer sequence, the first nitridic compound semiconductor layer has cavities which overlap the microcracks of the intermediate layer in a plan view. The microcracks that form in the intermediate layer form continuously through the intermediate layer at least in places. The first intermediate layer is thus in direct contact with the process gases during the growth of the intermediate layer at least in places in the region of the microcracks. By virtue of the selection of corresponding process gases, for example hydrogen, during the growth of the intermediate layer, the first nitridic compound semiconductor layer can enter into a reaction with at least one processing gas during the growth of the intermediate layer. By way of example, the first nitridic compound semiconductor layer reacts with hydrogen to form cavities or hollow spaces.

In the present context, "plan view" should be understood to mean a perspective parallel to the largest lateral extent of the semiconductor layer sequence. The viewing direction proceeds for example oppositely to the growth direction.

The cavities are formed during and/or directly after the growth of the intermediate layer. If the second nitridic compound semiconductor layer forms a continuous layer, then the microcracks of the intermediate layer are covered by the second nitridic compound semiconductor layer and no process gas can pass through the microcracks into the first nitridic compound semiconductor layer.

In accordance with at least one embodiment of the semiconductor layer sequence, the semiconductor layer sequence comprises an active layer, which is suitable for receiving and/or generating electromagnetic radiation and is disposed downstream of the second nitridic compound semiconductor layer in the growth direction of the semiconductor layer sequence. The active layer of the semiconductor layer sequence can be formed by the second nitridic compound semiconductor layer. By way of example, the second nitridic compound semiconductor layer can have n-doped and p-doped regions, wherein the active layer can form between the n-doped region and the p-doped region.

Here and hereinafter, the designation "electromagnetic radiation" can denote electromagnetic radiation having at least one wavelength or one spectral component in an infrared to ultraviolet wavelength range. In particular, this can designate infrared, visible and/or ultraviolet electromagnetic radiation.

In accordance with at least one embodiment of the semiconductor layer sequence, the cavities of the first nitridic compound semiconductor layer are free of the first nitridic compound semiconductor layer and electromagnetic radiation generated in the active layer passes through the cavities in such a way that the electromagnetic radiation is refracted upon the electromagnetic radiation entering and exiting at interfaces of the cavities. The electromagnetic radiation generated in the active layer of the semiconductor layer sequence during operation can pass toward the outside in particular opposite to the growth direction of the semiconductor layer sequence.

When the electromagnetic radiation passes through the semiconductor layer sequence described here, the electromagnetic radiation impinges on the interfaces of the cavities at least in places. In the present context, "interfaces of the cavities" should be understood to mean interfaces that forms between outer surfaces of a hollow space of the first nitridic compound semiconductor layer sequence and the nitride compound semiconductor material of the first nitridic compound semiconductor layer. The electromagnetic radiation is at least partly refracted at these hollow spaces and/or cavities upon entering and exiting. Furthermore, it is possible for the electromagnetic radiation to be diffusely scattered at least partly at a rough outer surface of the cavities.

Furthermore, a method for producing the semiconductor layer sequence is described. By way of example, a semiconductor layer sequence described here can be produced by means of the method. That is to say that the features presented for the method for producing a semiconductor layer sequence as described here are also disclosed for a semiconductor layer sequence described here, and vice versa.

The method order described below is mandatorily predefined with regard to the first nitridic compound semiconductor layer, the intermediate layer and the second nitridic compound semiconductor layer. Optional layers such as, for example, nucleation layer and/or masking layer are optional elements of the semiconductor layer sequence described here.

In accordance with at least one embodiment of the method, a growth substrate having a growth surface and substrate surface opposite the growth surface is provided, wherein the growth surface comprises a silicon. The growth surface can have in particular a [111] crystal orientation of the silicon.

In accordance with at least one embodiment of the method, a nucleation layer is grown on the growth surface of the growth substrate. The nucleation layer can be an epitaxial layer which is deposited and/or grown for example at the same temperature as the subsequent first nitridic compound semiconductor layer. The nucleation layer is an optional layer of the semiconductor layer sequence described here. The nucleation layer can comprise for example an AlN and/or an AlGaN. The nucleation layer can supply a multiplicity of crystallization nuclei for the subsequently deposited and/or grown first nitridic compound semiconductor layer.

In accordance with at least one embodiment of the method, the first nitridic compound semiconductor layer is grown on a side of the nucleation layer facing away from the growth substrate.

In accordance with at least one embodiment of the method, the intermediate layer is grown on a side of the first nitridic compound semiconductor layer facing away from the growth substrate, wherein the lattice constant of the intermediate layer at least in places is different than that of the first nitridic compound semiconductor layer. That is to say that the intermediate layer grows with a different lattice constant than the first nitridic compound semiconductor layer. The non-lattice-latched or non-pseudomorphic growth of the intermediate layer can be controlled, regulated and/or determined by the correspondingly selected process parameters during growth.

In accordance with at least one embodiment of the method, the microcracks form in the intermediate layer during the process of growing the intermediate layer. As a result of the procedurally controlled non-pseudomorphic or non-lattice-latched growth of the intermediate layer on the first nitridic compound semiconductor layer, microcracks form in the intermediate layer with increasing thickness and/or increasing aluminum content of the intermediate layer. By way of example, a material gradient can form with regard to the aluminum content in the intermediate layer, wherein the aluminum content can increase with increasing thickness in a direction facing away from the first nitridic compound semiconductor layer. In the present context, "thickness" should be understood to mean the vertical extent of the intermediate layer in the direction of the growth direction of the semiconductor layer sequence.

In accordance with at least one embodiment of the method, the second nitridic compound semiconductor layer grows in a lattice-matched fashion at least in places on a side of the intermediate layer facing away from the growth substrate, wherein the microcracks are filled by the second nitridic compound semiconductor layer at least in places and the second nitridic compound semiconductor layer is grown on the intermediate layer in a compressively strained fashion.

During the initial growth of the second nitridic compound semiconductor layer, the microcracks formed in the intermediate layer are filled by the nitride compound semiconductor material of the second nitridic compound semiconductor layer or the second nitridic compound semiconductor layer grows in the microcracks. At the same time, the second nitridic compound semiconductor layer grows in a island-like fashion on the separate intermediate layer blocks and/or intermediate layer islands formed.

With an increasing coating duration and/or growth duration, the islands of the second nitridic compound semiconductor layer fuse with the second nitridic compound semiconductor layer from the microcracks of the intermediate layer to form a continuous laterally homogeneous second nitridic compound semiconductor layer, a compressive strain forming in the second nitridic compound semiconductor layer.

In accordance with at least one embodiment of the method, the active layer is grown on a side of the lattice-matched second nitridic compound semiconductor layer facing away from the substrate, wherein the active layer is suitable for receiving and/or generating the electromagnetic radiation. Therefore, with the methods described here, a semiconductor layer sequence is produced which is able to generate radiation during operation. The emission wavelength generated by the semiconductor layer sequence is at least partly dependent on the composition of the nitride compound semiconductor material.

In accordance with at least one embodiment of the method for producing the semiconductor layer sequence, the growth substrate is removed chemically and/or mechanically and a lateral roughening at least in places are formed at least in places in the first nitridic compound semiconductor layer, the intermediate layer and the second nitridic compound semiconductor layer in a direction facing away from the active layer. For chemically removing the substrate it is possible to have recourse to a wet-chemical KOH etching method or a dry-chemical etching method, for example. A combination of wet- and dry-chemical methods is furthermore conceivable. Mechanical removal can be carried out by grinding, in particular. Furthermore, a combination of a chemical and mechanical method is conceivable. As a result of the removal of the growth substrate, in particular the optional nucleation layers and/or masking layers of the first nitridic compound semiconductor layer are removed at least in places. After the removal of the growth substrate, the semiconductor layer sequence provided for generating electromagnetic radiation comprises the first nitridic compound semiconductor layer at least in places.

In accordance with at least one embodiment of the method for producing the semiconductor layer sequence, the intermediate layer is grown under the influence of hydrogen, wherein the hydrogen comes into contact with the first nitridic compound semiconductor layer through the microcracks that form, such that the first nitridic compound semiconductor layer reacts with the hydrogen in such a way that the cavities are formed in the first nitridic compound semiconductor layer on the basis of a chemical reaction. By virtue of the microcracks, processing gas, in particular gaseous hydrogen, can pass through the microcracks into the first nitridic compound semiconductor layer, which microcracks can then lead to the formation of hollow spaces or cavities.

In particular, hydrogen can be understood as a processing gas, which hydrogen additionally supports the non-lattice-matched or non-pseudomorphic growth of the intermediate layer on the first nitridic compound semiconductor layer. Hydrogen is an optional processing gas and is used in particular as a supporting processing gas or purge gas, but is not necessary for forming the semiconductor layer sequence described here. Rather, the formation of cavities in the first nitridic compound semiconductor layer can be regarded as evidence of the formation of the microcracks in the intermediate layer.

In accordance with at least one embodiment of the method for producing the semiconductor layer sequence, after the semiconductor layer sequence has been formed, the semiconductor layer sequence is cooled and no microcracks are formed in the semiconductor layer sequence during cooling.

It has surprisingly been found, as a result of the method described here, that the compressive strain of the second nitridic compound semiconductor layer and thus of the semiconductor layer sequence suffices to counteract a tensile stress that arises during cooling in such a way that no macrocracks form.

The compressive strain of the second nitridic compound semiconductor layer leads, in particular, to a compressive strain of the semiconductor layer sequence described here.

In accordance with at least one embodiment of the method, the first nitridic compound semiconductor layer comprises the masking layer.

BRIEF DESCRIPTION OF THE DRAWINGS

The semiconductor layer sequence described here and a method for producing a semiconductor layer sequence are explained below on the basis of exemplary embodiments with associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1:
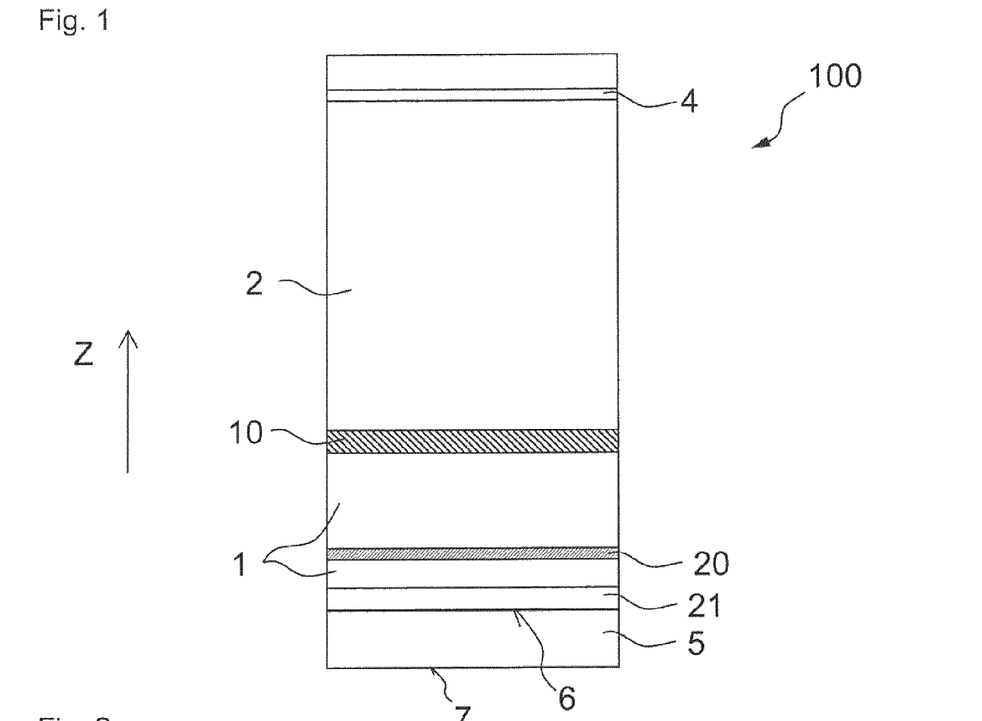
FIG. 1 shows a schematic side view of a semiconductor layer sequence described here.

FIG. 1 shows one exemplary embodiment of a semiconductor layer sequence 100 comprising a growth substrate 5 having a growth surface 6 and a substrate surface 7 opposite the growth surface 6, a nucleation layer 21, a first nitridic compound semiconductor layer 1 with integrated masking layer 20, an intermediate layer 10 and a second nitridic compound semiconductor layer 2 with active layer 4. The individual layers of the semiconductor layer sequence 100 are grown epitaxially on the growth surface 6 of the growth substrate 5 in a manner adjoining one another successively in the growth direction Z. The growth surface 6 has a [111] crystal orientation, for example. The nucleation layer 21 and the masking layer 20 should be regarded as optional layer elements which can promote the growth of the first nitridic compound semiconductor layer 1, in particular.

The first nitridic compound semiconductor layer 1 can have a thickness of 30 nm to 2000 nm, for example.

The second nitridic compound semiconductor layer 2 can have a thickness of 30 nm to 5000 nm.

As shown in FIG. 1, the intermediate layer 10 adjoins the first nitridic compound semiconductor layer 1 and the second nitridic compound semiconductor layer 2.

Figure 2:
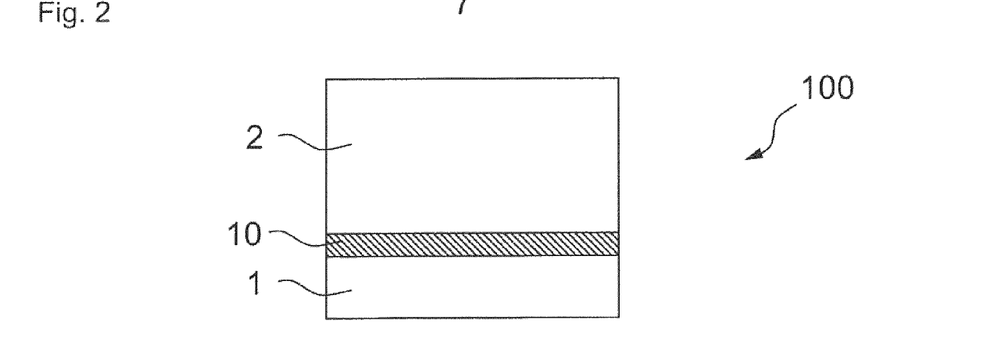
FIG. 2 shows a further schematic side view of a partial region of the semiconductor layer sequence.

FIG. 2 illustrates the first nitridic compound semiconductor layer 1 with the succeeding intermediate layer 10 and the second nitridic compound semiconductor layer 2 adjoining the intermediate layer 10. The intermediate layer 10 grows on the first nitridic compound semiconductor layer 1 in a non-lattice-matched fashion and has a thickness of between 5 nm and 100 nm. The second nitridic compound semiconductor layer 2 grows on the intermediate layer 10 in a lattice-matched fashion.

With increasing thickness and/or increasing aluminum content of the intermediate layer 10, the intermediate layer 10 relaxes in such a way that microcracks 11 form in the intermediate layer 10 (see FIGS. 3a to 3c and FIGS. 4a, 4b and FIG. 8). The intermediate layer 10 has in particular an aluminum content of 85 to 100% and, in the relaxed state, thus has a smaller lattice constant than the first nitridic compound semiconductor layer 1 and the second nitridic compound semiconductor layer 2. The semiconductor layer sequence 100 illustrated in FIG. 2 comprises nitride compound semiconductor materials. The first nitridic compound semiconductor layer 1 comprises a nitride compound semiconductor material which comprises or consists of $Al_nGa_mIn_{1-n-m}N$, wherein $0 \leq n \leq 1$, $0 \leq m \leq 1$ and $n+m \leq 1$, the second nitridic compound semiconductor layer 2 comprises a further nitride compound semiconductor material, which comprises or consists of $Al_xIn_yGa_{1-x-y}N$, wherein $0 \leq x \leq 1$, $0 \leq y \leq 1$ and $x+y \leq 1$, and the intermediate layer 10 comprises a nitride compound semiconductor material which comprises or consists of $Al_rIn_sGa_{1-r-s}N$, wherein $0 < r \leq 1$, $0 \leq s \leq 1$ and $r+s \leq 1$.

The indices n, m can in particular deviate from the indices x, y or be identical. By way of example, the indices n, m with respect to the indices x, y deviate from one another by 10% in each case.

As a result of the microcracks 11 in the intermediate layer 10, the intermediate layer 10 comprises individual intermediate layer blocks and/or intermediate layer islands, wherein the intermediate layer blocks and/or intermediate layer islands are not in direct contact with one another at least in places. The individual intermediate layer blocks and/or intermediate layer islands in total describe the intermediate layer 10. The microcracks 11 that form are based in particular on relaxation of the intermediate layer 10 during the growth process of the intermediate layer 10. The distances between the individual intermediate layer blocks and/or intermediate layer islands can be between 1 μm and 500 μm. The second nitridic compound semiconductor layer 2 grows in the microcracks 11 of the intermediate layer 10 and the intermediate layer blocks and/or intermediate layer islands formed by the microcracks 11. The second nitridic compound semiconductor layer 2 grown on the intermediate layer 10 is lattice-matched to the intermediate layer 10.

Figure 3A:
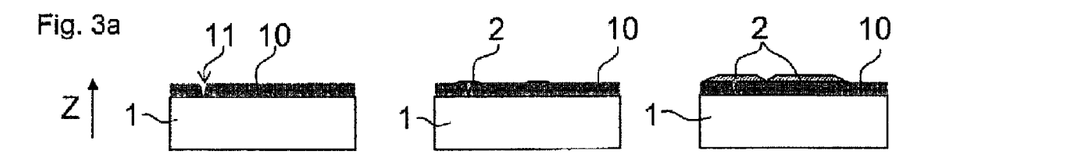
FIGS. 3a, 3b and 3c show different exemplary embodiments of an intermediate layer described here after different growth times.
Figure 3B:
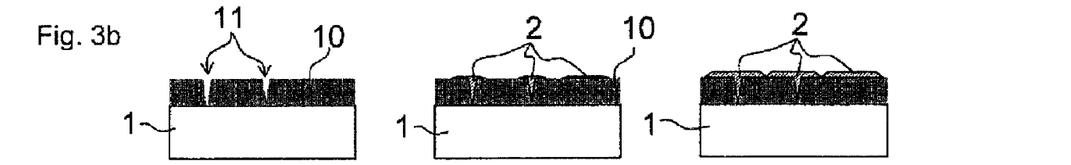
Figure 3C:
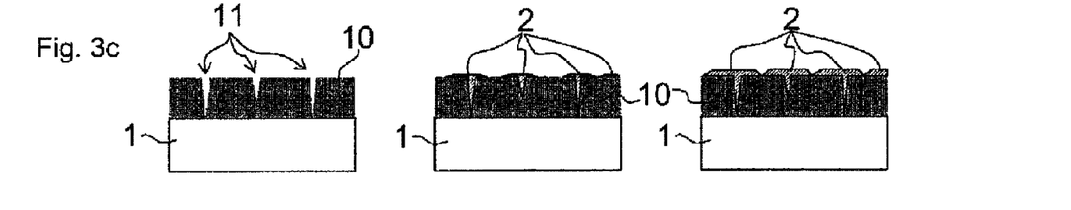

FIGS. 3a, 3b and 3c in each case show intermediate layers 10, wherein the intermediate layer 10 shown in FIG. 3b has a larger thickness than in FIG. 3a. The larger thickness of the intermediate layer 10 from FIG. 3b is attributable to a longer growth time of the intermediate layer 10, which here specifically is longer by a factor of 1.67. The same correspondingly applies to the intermediate layer 10 in FIG. 3c, which, in comparison with the intermediate layer 10 in FIG. 3a, was grown for longer than the intermediate layer 10 in FIG. 3a by a factor of 2.67. As becomes evident from FIGS. 3a, 3b and 3c, the number of microcracks 11 increases as the growth duration increases. Besides the growth duration of the intermediate layer 10, the increasing number of microcracks 11 is also dependent on the aluminum content of the intermediate layer 10.

In other words, the intermediate layer 10, which grows in a non-lattice-matched fashion on the first nitridic compound semiconductor layer 1, relaxes better with increasing layer thickness of the intermediate layer 10 and/or with increasing aluminum content of the intermediate layer 10. As is evident from FIGS. 3a, 3b and 3c, the second nitridic compound semiconductor layer grows in the microcracks 11 of the intermediate layer 10 and the intermediate layer blocks and/or intermediate layer islands of the intermediate layer 10 that are formed. In this case, it was surprisingly established that the second nitridic compound semiconductor layer 2 grows in a compressively strained fashion and this compressive strain of the second nitridic compound semiconductor layer 2 is all the higher, the higher the number of microcracks 11 in the intermediate layer 10. In other words, the second nitridic compound semiconductor layer 2 experiences a great compressive strain on the basis of the intermediate layer 10.

As the growth time of the second nitridic compound semiconductor layer 2 increases, the further nitride compound semiconductor material of the second nitridic compound semiconductor layer 2 from the microcracks and together with the further nitride compound semiconductor material of the second nitridic compound semiconductor layer 2 that was grown on the intermediate layer blocks and/or intermediate layer islands fuses to form a laterally homogeneously formed second nitridic compound semiconductor layer 2. In particular, defects or faulty dislocations within the second nitridic compound semiconductor layer 2 can be reduced during the fusing of the further nitride compound semiconductor material of the second nitridic compound semiconductor layer 2.

Figure 4A:
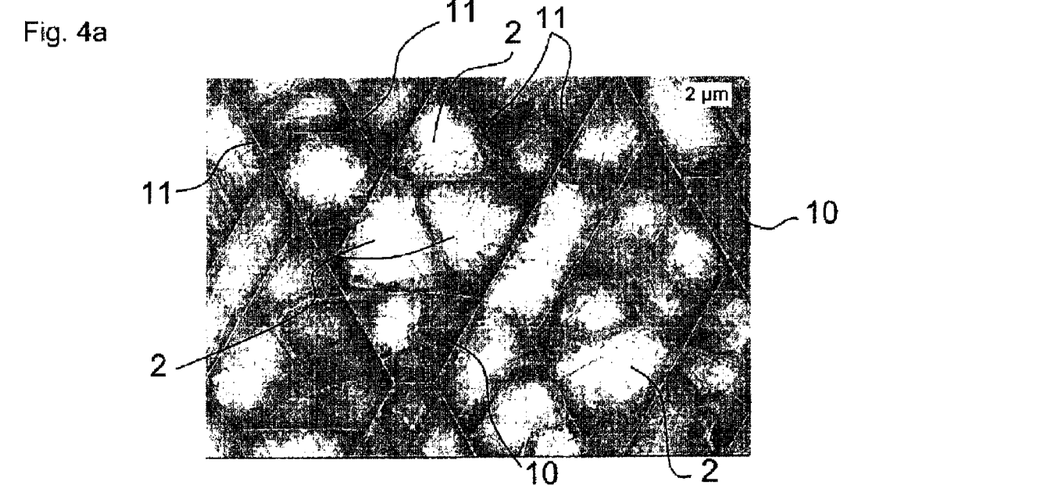
FIG. 4a shows an SEM (scanning electron microscopy) micrograph of a plan view of the intermediate layer after the growth of the second nitridic compound semiconductor layer with a thickness of 10 nm.

In FIG. 4a, the SEM micrograph shows a plan view of the intermediate layer 10 with microcracks 11 having formed, wherein the second nitridic compound semiconductor layer 2 is formed and/or grown with a thickness of 10 nm on the intermediate layer 10. The second nitridic compound semiconductor layer 2 is represented by the light grey regions. The dark grey regions show the intermediate layer 10.

FIG. 4a shows the intermediate layer blocks and/or intermediate layer islands which are formed by the microcracks 11 and on which the second nitridic compound semiconductor layer 2 is at least partly grown. FIG. 4a furthermore shows exposed regions of the intermediate layer 10 which still have no second nitridic compound semiconductor layer 2.

FIG. 4a shows island-like growth of the second nitridic compound semiconductor layer 2 on the intermediate layer blocks and/or intermediate layer islands that are formed.

Figure 4B:
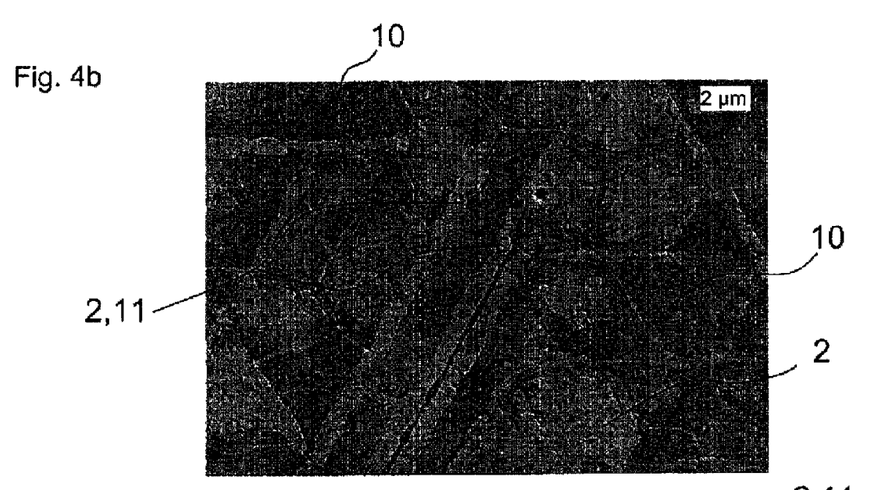
FIG. 4b shows the exemplary embodiment from FIG. 4a after the growth of the second nitridic compound semiconductor layer with a thickness of 50 nm.

FIG. 4b shows the micrograph from FIG. 4a, with the difference that the second nitridic compound semiconductor layer 2 is formed with a thickness of 50 nm on the intermediate layer 10. In FIG. 4b, the regions of the second nitridic compound semiconductor layer 2 that are grown in the microcracks 11 fuse with the regions of the second nitridic compound semiconductor layer 2 that are grown on the intermediate layer blocks and/or intermediate layer islands.

Figure 5A:
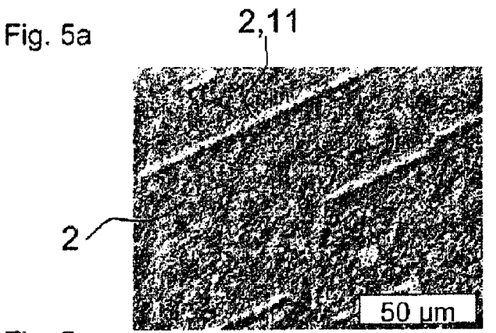
FIGS. 5a, 5b and 5c show Normarski microscopy micrographs with an edge filter, wherein a 250 nm thick second nitridic compound semiconductor layer were grown onto intermediate layers of different thicknesses.
Figure 5B:
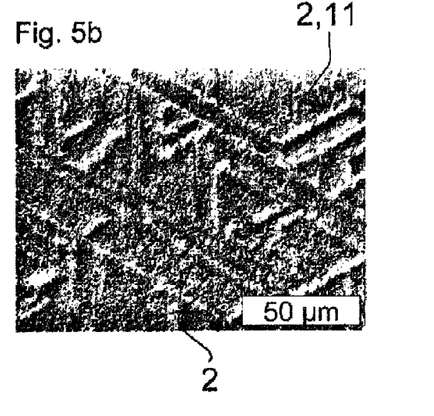
Figure 5C:
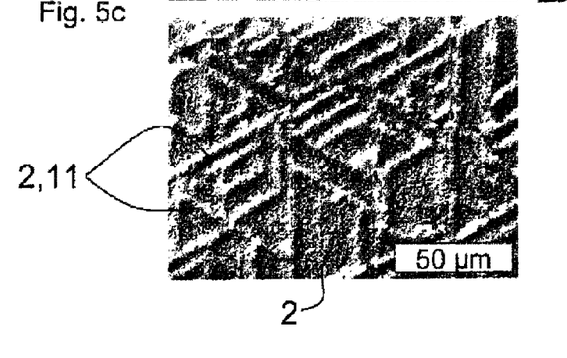

FIGS. 5a, 5b and 5c show Normarski microscopy micrographs with an edge filter in a plan view of the second nitridic compound semiconductor layer 2 having a thickness of 250 nm, wherein the three micrographs differ from one another with regard to the growth time of the intermediate layer as described in FIGS. 3a, 3b and 3c. That is to say that the intermediate layer in FIG. 5b was grown for longer by a factor of 1.67. With regard to FIG. 5c, therefore, in comparison with the intermediate layer in FIG. 5a, the intermediate layer 10 was grown for longer by a factor of 2.67. The micrographs in FIGS. 5a, 5b and 5c clearly show that as the growth time of the intermediate layer increases, the number of microcracks increases and this superficial morphology of the intermediate layer 10 can be reflected in the second nitridic compound semiconductor layer 2. In other words, the compressive strain in the second nitridic compound semiconductor layer 2 grown in a lattice-matched fashion on the intermediate layer 10 increases with an increasing number of microcracks 11 in the intermediate layer 10.

Figure 6:
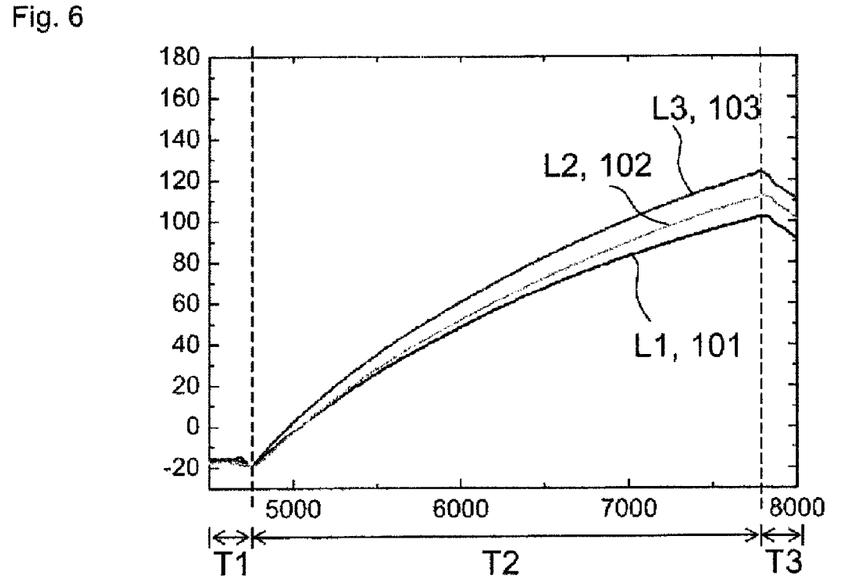
FIG. 6 shows a graph with measurement results regarding in-situ wafer curvatures as a function of a growth time.

The observations shown in particular in the micrographs in FIGS. 5a, 5b and 5c are demonstrated metrologically in FIG. 6 by measurement curves of an in-situ wafer curvature with the unit [1/km] as a function of the growth time with the unit [s].

FIG. 6 shows three measurement curves L1, L2 and L3. The three measurement curves L1, L2 and L3 in each case describe an in-situ wafer curvature as a function of the growth time of the intermediate layer 10. The growth time is represented on the X-axis, wherein the X-axis illustrated in FIG. 6 is subdivided into three time intervals T1, T2 and T3. In the graph in FIG. 6, the time interval T1 describes the in-situ wafer curvature before the growth of the second nitridic compound semiconductor layer 2 onto the intermediate layer 10. The growth of the second nitridic compound semiconductor layer 2 on the intermediate layer 10 as described here then takes place during the time interval T2. Cooling of the semiconductor layer sequences 100 described here takes place during the third time interval T3. The measurement curve L1 describes a first semiconductor layer sequence 101, L2 describes a second semiconductor layer sequence 102 and L3 describes a third semiconductor layer sequence L3.

The measurement curves differ with regard to the structure of the semiconductor layer sequence 101, 102 and 103 in that the intermediate layer 10 was grown on the first nitridic compound semiconductor layer 1 for different lengths of time. That is to say that the measurement curve L2 involves the second nitridic compound semiconductor layer 102, the intermediate layer of which was grown on the first nitridic compound semiconductor layer 1 for longer by a factor of 1.67 than in the case of the first semiconductor layer sequence 101 of the measurement curve L1. The measurement curve L3 describes a measurement curve of a third semiconductor layer sequence 103, wherein the intermediate layer 10 of the measurement curve L3 was grown on the first nitridic compound semiconductor layer 1 for longer by a factor of 2.67 than in the measurement curve L1.

It can be discerned from the measurement curve profile of the measurement curves L1, L2 and L3 that as the growth time of the intermediate layer increases, the in-situ wafer curvature during the growth of the second nitridic compound semiconductor layer 2 also increases. In other words, the graph in FIG. 6 demonstrated metrologically that, as a result of an increasing number of microcracks 11 in the intermediate layer 10, the second nitridic compound semiconductor layer 2 growing thereon has a higher compressive strain.

Figure 7:
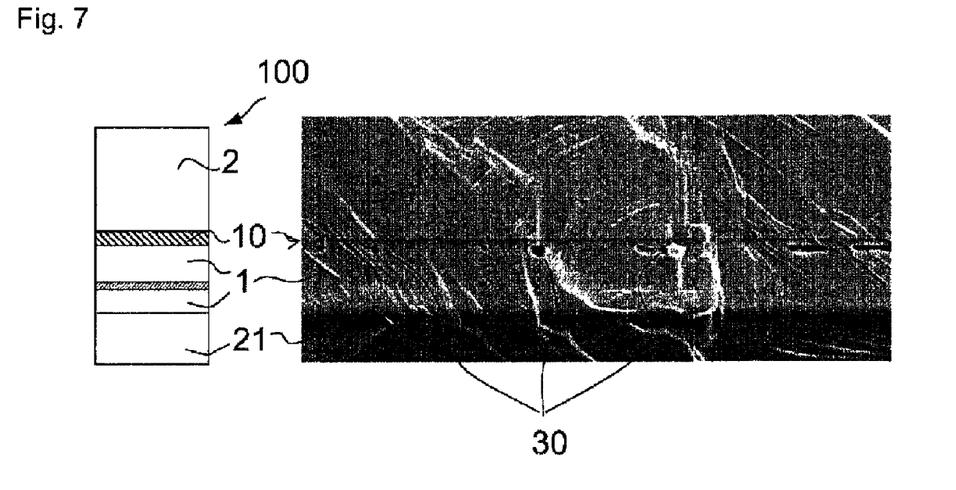
FIG. 7 shows a schematic illustration and an SEM micrograph of a side view of the semiconductor layer sequence.

FIG. 7 shows a schematic side view of the semiconductor layer sequence 100 as shown in FIG. 1, with the difference that, in the corresponding micrograph of the semiconductor layer sequence 100, cavities 30 are formed in the first nitridic compound semiconductor layer below the microcracks formed in the intermediate layer 10. The cavities 30 form in particular during the growth of the second nitridic compound semiconductor layer 2 if, during the growth of the second nitridic compound semiconductor layer 2, hydrogen 40, for example, is available and/or present in gaseous form during the growth in the growth chamber. In this case, the hydrogen passes through the microcracks 11 of the intermediate layer 10 and reacts chemically with the first nitridic compound semiconductor layer 1 of the semiconductor layer sequence 100. The formation of the cavities 30 in the first nitridic compound semiconductor layer 1 can be controlled by regulation and/or control of the gas flow during the growth of the second nitridic compound semiconductor layer 2, in particular. The presence or addition of gaseous hydrogen during the growth or production of the semiconductor layer sequence 100 can optionally be interposed, but is not necessary for the formation of the microcracks 11 in the intermediate layer 10.

Figure 8:
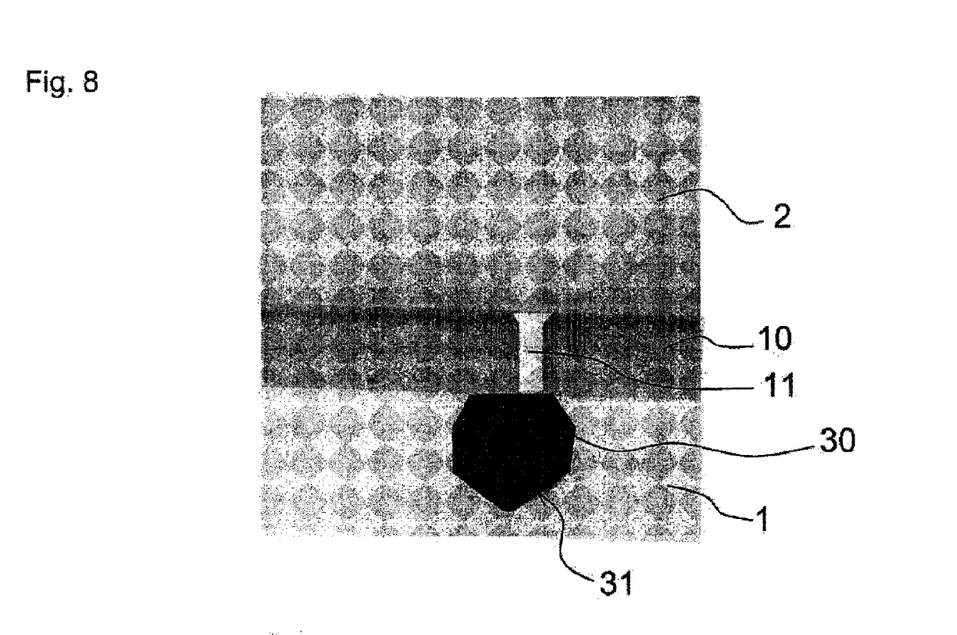
FIG. 8 shows a TEM (transmission electron microscopy) micrograph of the semiconductor layer sequence.

FIG. 8 shows a TEM micrograph of a side view of the semiconductor layer sequence 100. FIG. 8 shows that the cavity 30 formed below a microcrack 11. In this case, the cavity 30 is formed in the first nitridic compound semiconductor layer 1. Electromagnetic radiation that can be generated in the active layer 4 can be refracted in particular at interfaces 31 of the cavity 30. The cavity 30 is free of a material of the first nitridic compound semiconductor layer 1. That is to say that the cavity 30 is a hollow space situated in the first nitridic compound semiconductor layer 1. The electromagnetic radiation can be refracted and/or diffusely scattered at interfaces 31 of the cavity 30.

Figure 9:
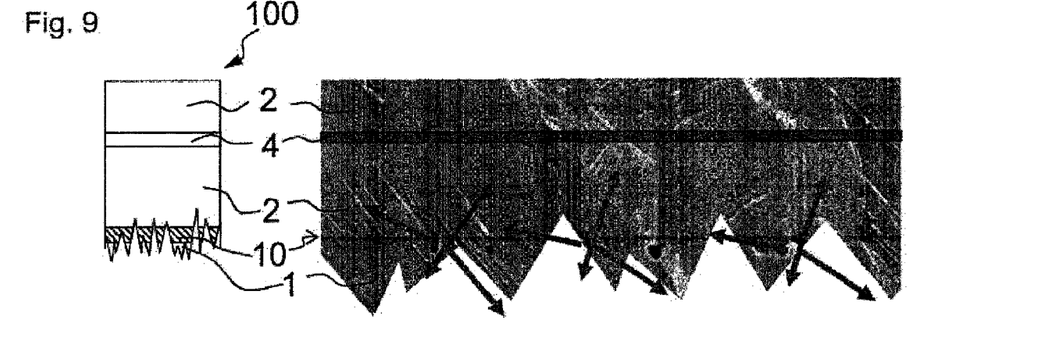
FIG. 9 shows a schematic view and a micrograph of the semiconductor layer sequence with an active layer and after the removal of a growth substrate.
Figures 10A, 10B, 11:
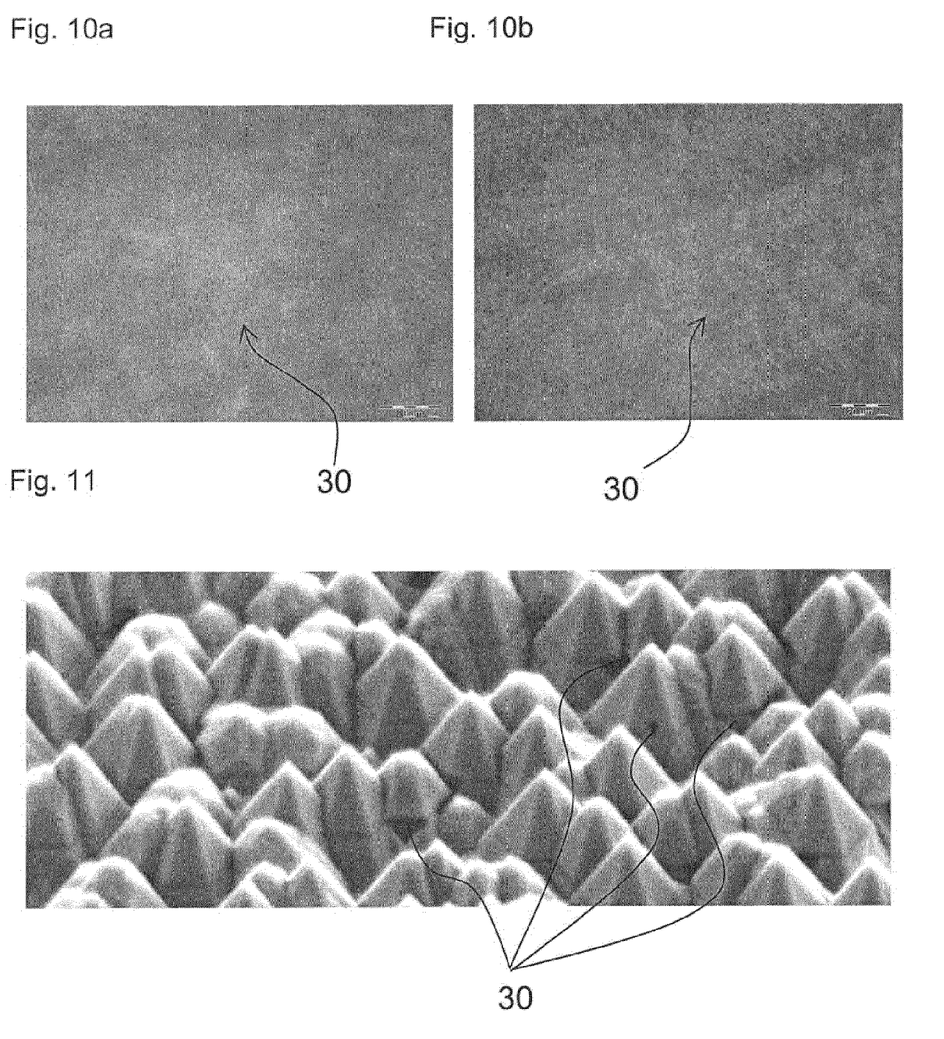
FIGS. 10a and 10b show PL (photoluminescence) micrographs of a radiation exit surface of the semiconductor layer sequence after single and double exposure time.
FIG. 11 shows an SEM micrograph of the semiconductor layer sequence after the removal of the growth substrate and performance of a roughening process.

FIG. 9 shows a schematic illustration of a semiconductor layer sequence 100 described here with a corresponding micrograph. The growth substrate 5 is no longer present in FIG. 10. In particular, chemical and mechanical methods can be used for removing the growth substrate. By way of example, the growth substrate 5 can be removed by KOH. Furthermore, the active layer 4 is formed in the second nitridic compound semiconductor layer 2. The electromagnetic radiation generated in the active layer 4 is refracted and/or diffusely scattered in particular upon passing through the cavities 30 or at the interfaces 31 of the cavities 30.

FIGS. 10a and 10b show photoluminescence micrographs of radiation exit surfaces of the semiconductor layer sequence 100 which were recorded for a first exposure time and a doubled exposure time. The bright pixels show the electromagnetic radiation refracted at the cavities 30. The cavities 30 in the first nitridic compound semiconductor layer 1 demonstrably lead to better scattering of the electromagnetic radiation that was generated in the active layer 4.

FIG. 11 shows a micrograph of a morphology of the semiconductor layer sequence 100 after the removal of the growth substrate 5. In FIG. 11, the growth substrate 5 is removed by chemical etching, for example HF and $HNO_3$, and a roughening process is carried out. The cavities 30 identified in FIG. 11 were additionally enlarged in particular during the removal of the growth substrate 5 or by the roughening process. By way of example, the cavities 30 react with the chemical medium and react on account of the larger interface 31 in the cavities 30 in such a way that the cavities form a larger spatial extent.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A semiconductor layer sequence comprising:
   a first nitridic compound semiconductor layer;
   an intermediate layer overlying and directly adjoining the first nitridic compound semiconductor layer, wherein the intermediate layer at least in places has a different lattice constant than the first nitridic compound semiconductor layer; and
   a second nitridic compound semiconductor layer overlying and directly adjoining the intermediate layer, wherein the second nitridic compound semiconductor layer is lattice-matched to the intermediate layer at least in places, and wherein the intermediate layer has an aluminum content that is greater than an aluminum content of the first nitridic compound semiconductor layer and an aluminum content of the second nitridic compound semiconductor layer.

2. The semiconductor layer sequence according to claim 1, wherein the first nitridic compound semiconductor layer comprises a nitride compound semiconductor material which comprises $Al_n In_m Ga_{1-n-m}N$, wherein $0 \leq n \leq 1$, $0 \leq m \leq 1$ and $n+m \leq 1$, the second nitridic compound semiconductor layer comprises a further nitride compound semiconductor material, which comprises $Al_x In_y Ga_{1-x-y}N$, and the intermediate layer comprises a nitride compound semiconductor material which comprises $Al_r In_s Ga_{1-r-s}N$, wherein $0 \leq r \leq 1$, $0 \leq s \leq 1$ and $r+s \leq 1$.

3. The semiconductor layer sequence according to claim 2, wherein the nitride compound semiconductor material of the first nitridic compound semiconductor layer and the further nitride compound semiconductor material of the second nitridic compound semiconductor layer are identical.

4. The semiconductor layer sequence according to claim 1, wherein the intermediate layer comprises microcracks and the second nitridic compound semiconductor layer is present in the microcracks at least in places.

5. The semiconductor layer sequence according to claim 4, wherein the first nitridic compound semiconductor layer has cavities that overlap the microcracks of the intermediate layer in a plan view.

6. The semiconductor layer sequence according to claim 5, wherein the cavities of the first nitridic compound semiconductor layer are free of the first nitridic compound semiconductor layer and electromagnetic radiation generated in an active layer passes through the cavities in such a way that the electromagnetic radiation is refracted upon the electromagnetic radiation entering and exiting at interfaces of the cavities.

7. The semiconductor layer sequence according to claim 1, wherein the intermediate layer has a smaller lattice constant than the first nitridic compound semiconductor layer and second nitridic compound semiconductor layer.

8. The semiconductor layer sequence according to claim 1, wherein the first nitridic compound semiconductor layer comprises a masking layer.

9. The semiconductor layer sequence according to claim 1, wherein the intermediate layer has a layer thickness of between 5 nm and 100 nm.

10. The semiconductor layer sequence according to claim 1, wherein the second nitridic compound semiconductor layer is compressively strained.

11. The semiconductor layer sequence according to claim 1, further comprising an active layer overlying second nitridic compound semiconductor layer, the active layer being suitable for receiving and/or generating electromagnetic radiation during operation.

12. The semiconductor layer sequence according to claim 1, wherein the intermediate layer has an aluminum concentration between 10% and 95%, and wherein the aluminum concentration is increased in a direction of the second nitridic compound semiconductor layer.

13. A semiconductor layer sequence comprising:
a first nitridic compound semiconductor layer;
an intermediate layer overlying and directly adjoining the first nitridic compound semiconductor layer, wherein the intermediate layer at least in places has a different lattice constant than the first nitridic compound semiconductor layer; and
a second nitridic compound semiconductor layer overlying and directly adjoining the intermediate layer, wherein the second nitridic compound semiconductor layer is lattice-matched to the intermediate layer at least in places,
wherein the intermediate layer comprises microcracks, and
wherein the first nitridic compound semiconductor layer has cavities that overlap the microcracks of the intermediate layer in a plan view.

* * * * *

UNITED STATES PATENT AND TRADEMARK OFFICE
CERTIFICATE OF CORRECTION

PATENT NO.       : 9,806,224 B2                                Page 1 of 1
APPLICATION NO.  : 14/763464
DATED            : October 31, 2017
INVENTOR(S)      : Werner Bergbauer It is certified that error appears in the above-identified patent and that said Letters Patent is hereby corrected as shown below:

In the Claims

In Column 16, Line 45-46, Claim 2, delete "wherein $0 \leq r \leq 1$, $0 \leq s \leq 1$ and $r + s \leq 1$" and insert --wherein $0 < r \leq 1$, $0 \leq s \leq 1$ and $r + s \leq 1$--.

Signed and Sealed this
Sixth Day of February, 2018

Joseph Matal
*Performing the Functions and Duties of the*
*Under Secretary of Commerce for Intellectual Property and*
*Director of the United States Patent and Trademark Office*